(12) United States Patent
Shiloh et al.

(10) Patent No.: US 9,953,802 B2
(45) Date of Patent: Apr. 24, 2018

(54) METHOD AND DEVICE FOR MANIPULATING PARTICLE BEAM

(71) Applicant: Ramot at Tel-Aviv University Ltd., Tel-Aviv (IL)

(72) Inventors: Roy Shiloh, Tel-Aviv (IL); Yossi Lereah, Petach-Tikva (IL); Ady Arie, Herzlia (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 0 days.

(21) Appl. No.: 15/112,716

(22) PCT Filed: Jan. 21, 2015

(86) PCT No.: PCT/IL2015/050072
§ 371 (c)(1),
(2) Date: Jul. 20, 2016

(87) PCT Pub. No.: WO2015/111049
PCT Pub. Date: Jul. 30, 2015

(65) Prior Publication Data
US 2016/0343536 A1    Nov. 24, 2016

Related U.S. Application Data

(60) Provisional application No. 61/929,583, filed on Jan. 21, 2014.

(51) Int. Cl.
*G21K 1/08* (2006.01)
*H01J 37/153* (2006.01)
*H01J 37/26* (2006.01)

(52) U.S. Cl.
CPC ............ *H01J 37/153* (2013.01); *H01J 37/26* (2013.01); *H01J 37/261* (2013.01);
(Continued)

(58) Field of Classification Search
CPC .. H01J 37/00; H01J 37/02; H01J 37/04; H01J 37/07; H01J 37/15; H01J 37/153;
(Continued)

(56) References Cited

U.S. PATENT DOCUMENTS 3,569,698 A * 3/1971 Herrman ............... H01J 37/153
250/398
3,596,090 A    7/1971 Hoppe
(Continued)

FOREIGN PATENT DOCUMENTS

CN       1494732      5/2004
WO    WO 2015/111049   7/2015

OTHER PUBLICATIONS

International Preliminary Report on Patentability dated Aug. 4, 2016 From the International Bureau of WIPO Re. Application No. PCT/IL2015/050072.
(Continued)

*Primary Examiner* — Jason McCormack (57) ABSTRACT

A method of manipulating an electron beam is disclosed. The method comprises transmitting the beam through a phase mask selected to spatially modulate a phase of the beam over a cross-section thereof.

25 Claims, 5 Drawing Sheets

(52) U.S. Cl.
CPC ............... *H01J 2237/1532* (2013.01); *H01J 2237/1534* (2013.01); *H01J 2237/2614* (2013.01)

(58) Field of Classification Search
CPC .... H01J 37/26; H01J 37/295; H01J 37/32137; H01J 37/32146; H01J 37/32155; H01J 37/32128
USPC ............ 250/306, 307, 311, 396 R, 398, 400, 250/492.1, 492.2, 492.21, 492.22, 492.3, 250/493.1
See application file for complete search history.

(56) References Cited

U.S. PATENT DOCUMENTS

| | | | |
|---|---|---|---|
| 2002/0015900 A1* | 2/2002 | Petersen | G03F 1/29 430/5 |
| 2002/0160320 A1 | 10/2002 | Shields et al. | |
| 2004/0129880 A1* | 7/2004 | Okoroanyanwu | H01L 21/28123 250/311 |
| 2008/0296509 A1 | 12/2008 | Schroder et al. | |
| 2011/0133084 A1* | 6/2011 | Nagaoki | H01J 37/26 250/311 |
| 2013/0193322 A1* | 8/2013 | Blackburn | H01J 37/147 250/311 |
| 2013/0258301 A1* | 10/2013 | Dehe | H02N 99/00 355/55 |
| 2014/0166880 A1* | 6/2014 | Shiue | H01J 37/295 250/307 |
| 2015/0151972 A1* | 6/2015 | Buijsse | C01B 31/04 423/448 |

OTHER PUBLICATIONS

International Search Report and the Written Opinion dated May 10, 2015 From the International Searching Authority Re. Application No. PCT/IL2015/050072.
Haider et al. "Electron Microscopy Image Enhanced", Nature, 392: 768-769, Apr. 23, 1998.
Ito et al. "Nanofabrication of Solid-State Fresnel Lenses for Electron Optics", Nature, 394: 49-52, Jul. 2, 1998.
Kirkland "Improved High Resolution Image Processing of Bright Field Electron Micrographs. I. Theory", Ultramicroscopy, 15: 151-172, 1984.
Krivanek et al. "Towards Sub-A Electron Beams", Ultramicroscopy, 78: 1-11, 1999.
Tonomura et al. "Spherical-Aberration Correction of an Electron Lens by Holography", Japanese Journal of Applied Physics, 18(7): 1373-1377, Jul. 1979.
Notification of Office Action and Search Report dated Jun. 2, 2017 From the State Intellectual Property Office of the People's Republic of China Re. Application No. 201580013749.2 and Its Summary in English. (16 Pages).
Supplementary European Search Report and the European Search Opinion dated Aug. 21, 2017 From the European Patent Office Re. Application No. 15740062.3. (10 Pages).
Willasch "High Resolution Electron Microscopy With Profiled Phase Plates", Optik, XP009065017, 44(1): 17-36, Jan. 1, 1975.

\* cited by examiner

FIG. 6

METHOD AND DEVICE FOR MANIPULATING PARTICLE BEAM

RELATED APPLICATIONS

This application is a National Phase of PCT Patent Application No. PCT/IL2015/050072 having International filing date of Jan. 21, 2015, which claims the benefit of priority under 35 USC § 119(e) of U.S. Provisional Patent Application No. 61/929,583 filed on Jan. 21, 2014. The contents of the above applications are all incorporated by reference as if fully set forth herein in their entirety.

FIELD AND BACKGROUND OF THE INVENTION

The present invention, in some embodiments thereof, relates to particle beam manipulation and, more particularly, but not exclusively, to particle beam manipulation employing phase modulation.

A scanning electron microscope (SEM) and a scanning transmission electron microscope (STEM) are combined with an electron optical device such as an electron lens to form an extremely small electron beam crossover (hereinafter, will be referred to as a beam probe) on the plane of an observed sample. Transmission scattered electrons, reflected electrons, secondary electrons, or derived X-rays from a small region irradiated by the beam probe are measured to obtain information on the structure and composition of the small region. The electron microscope two-dimensionally scans the beam probe on the plane of a sample by means of an electromagnetic electron beam deflector, obtaining a two-dimensional image.

The resolution of a high-resolution electron microscope is far from being optimal, mainly due to the spherical aberration of the objective lens. Attempts have been made over the years to correct these aberrations. Known in the art are techniques which include taking a series of images of the object under variable objective focus conditions [E. J. Kirkland, Ultramicroscopy 15, 151-172 (1984)], and holographic techniques [A. Tonomura et al, Jpn. J. Appl. Phys. 18, 1373-1377 (1979)]. Also known are techniques that employ quadrupoleoctopole [O. L. Krivanek, Ultramicroscopy 78, 1-11 (1999)] or hexapole [M. Haider et al, Nature 392, 768 (1998)] electromagnetic correctors.

SUMMARY OF THE INVENTION

According to an aspect of some embodiments of the present invention there is provided a method of manipulating a particle beam. The method comprises transmitting the beam through a phase mask selected to spatially modulate a phase of a wavefront of the beam over a cross-section thereof.

According to some embodiments of the invention the phase modulation is selected to at least partially compensate for aberrations generated by a beam focusing system.

According to some embodiments of the invention the invention the method comprises applying a multipole electromagnetic field to the beam.

According to an aspect of some embodiments of the present invention there is provided a phase mask. The phase mask comprises a solid material being transmissive to a particle beam and being patterned such to spatially modulate a phase of a wavefront of the particle beam over a cross-section of the particle beam.

According to an aspect of some embodiments of the present invention there is provided a system for manipulating a particle beam, comprising a phase mask selected to spatially modulate the phase front of the beam over a cross-section thereof.

According to some embodiments of the invention the system comprises a beam focusing system, wherein the phase modulation is selected to at least partially compensate for aberrations generated by the beam focusing system.

According to some embodiments of the invention the system wherein the beam focusing system is positioned in front or behind the phase mask.

According to some embodiments of the invention the system wherein the beam focusing system is integrated with the phase mask.

According to an aspect of some embodiments of the present invention there is provided a particle beam system, comprising a particle beam source and a particle beam manipulation system, wherein the particle beam manipulation system comprises the system or phase mask as described herein.

According to some embodiments of the invention the system is configured as a transmission electron microscope system.

According to some embodiments of the invention the system is configured as a scanning electron microscope system.

According to some embodiments of the invention the system is configured as an electron beam tomography (EBT) system.

According to some embodiments of the invention the system is configured as an electron beam lithography system.

According to some embodiments of the invention the system is configured as spectroscopy system.

According to some embodiments of the invention the system is configured as a mass spectroscopy system.

According to some embodiments of the invention the system is configured as a free electron laser system.

According to some embodiments of the invention the system comprises an electromagnetic or electrostatic lens.

According to some embodiments of the invention the phase mask is selected to provide a predetermined pattern at an image plane of the beam focusing system.

According to some embodiments of the invention the phase mask is selected to provide a predetermined pattern at a diffraction plane of the beam focusing system.

According to some embodiments of the invention the aberrations comprise spherical aberrations.

According to some embodiments of the invention the aberrations comprise chromatic aberrations.

According to some embodiments of the invention the aberrations comprise at least one type of aberrations selected from the group consisting of astigmatism and trefoil.

According to some embodiments of the invention the phase mask is discrete.

According to some embodiments of the invention the phase mask is continuous.

According to some embodiments of the invention the phase mask is characterized by a rectangular lattice.

According to some embodiments of the invention the phase mask is characterized by a non-rectangular lattice.

According to some embodiments of the invention the phase mask is patterned such that a thickness of the phase mask varies across a surface thereof.

According to some embodiments of the invention the phase mask is patterned such that the phase mask is characterized by a thickness function that does not exceed a critical point in which the accumulated phase equals a predetermined threshold.

According to some embodiments of the invention the predetermined threshold is selected from the group consisting of about $\pi$ and about $\pi$.

According to some embodiments of the invention the phase mask is patterned such that the phase mask is a binary thickness phase mask.

According to some embodiments of the invention the particle beam is a substantially coherent particle beam.

According to some embodiments of the invention the particle beam is an electron beam.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

As used herein the terms "about" and "approximately" refer to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

BRIEF DESCRIPTION OF THE DRAWINGS

Some embodiments of the invention are herein described, by way of example only, with reference to the accompanying drawings and images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to particle beam manipulation and, more particularly, but not exclusively, to particle beam manipulation employing phase modulation.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 5:
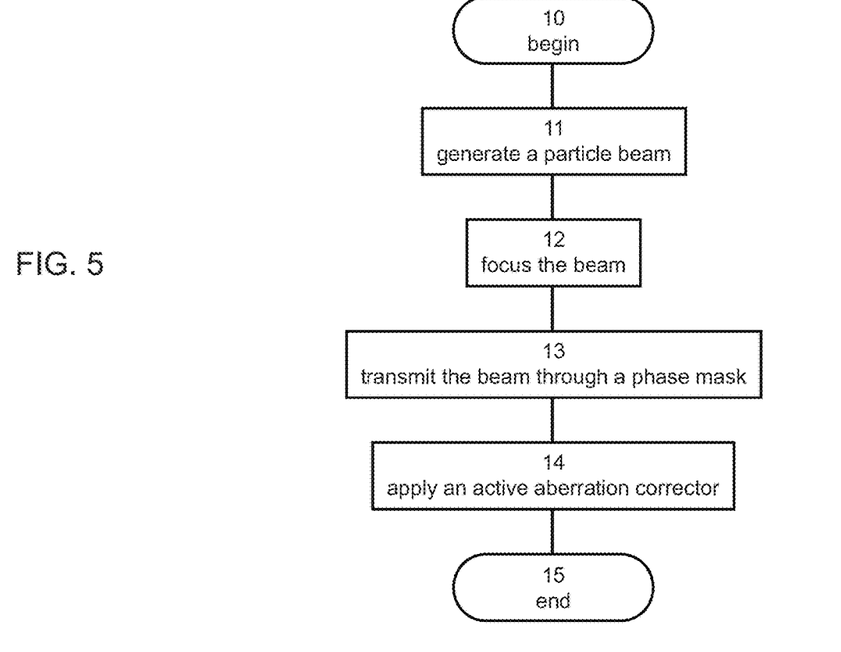
FIG. 5 is a flowchart diagram of a method suitable for manipulating a particle beam, according to various exemplary embodiments of the present invention.

FIG. 5 is a flowchart diagram of a method suitable for manipulating a particle beam, according to various exemplary embodiments of the present invention. It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The particle beam can be, for example, an electron beam, but other particle beams are also contemplated. Representative examples of such other beams include, without limitation, an ion beam, and a neutral particle beam (e.g., a beam of $C_{60}$ molecules, or a beam of particles selected from the group consisting of $I_2$, $SF_6$, $CFCl_3$, $WF_6$, F, Cl and perhalogenated carbon compounds).

The method can be employed in many applications. In preferred embodiments, the method is employed for reducing or eliminations aberration caused by a focusing system such as an electrostatic or electromagnetic lens.

One type of aberration that can be reduced or eliminated by the method of the present embodiments is spherical aberration. In conventional electron lenses, electrons that enter the lens' field at a distance from the lens axis are deflected more strongly than in proportion to this distance. Thus, the intersection of these electrons with the lens axis occurs at different points, causing what is commonly termed spherical aberration.

Another type of aberration that can be reduced or eliminated by the method of the present embodiments is chromatic aberration which results from the fact that electrons of different energies are deflected by different amounts by the focusing system. The method of the present embodiments can reduce or eliminate both longitudinal chromatic aberration and transverse chromatic aberration. In longitudinal chromatic aberration, electrons of different energies are brought to focus on different planes in the image space, which gives a blurring effect. Thus, longitudinal chromatic aberration arises due to the focal length varying with the electron energy. In transverse chromatic aberration, electrons of different energies from a single point are brought to focus to different points on the same image plane, resulting in a lateral shift of the image. Thus, transverse chromatic aberration can be seen as an effect due to magnification varying with electron energy.

Other types of aberration that can be reduced or eliminated by the method of the present embodiments include astigmatism and trefoil.

The particle beam (e.g., electron beam), manipulated by the method of the present embodiments, is preferably a substantially coherent particle beam. The degree of coherence of a particle beam can be quantified by a quantity known as the visibility that can be extracted from an intensity profile of an interference pattern generated by the beam. Denoting by $I_{max}$ the intensity at the highest peak of the profile and by $I_{min}$ the intensity of the valleys next to the highest peak, the visibility can be defined as $V=(I_{max}-I_{min})/(I_{max}+I_{min})$.

As used herein, "substantially coherent particle beam" refers to a particle beam characterized by visibility of at least 0.3 or at least 0.4 or at least 0.5.

The particle beam can be generated by any system employing particle beam, e.g., electron beam. Representative examples including, without limitation, a transmission electron microscope (TEM) system, a scanning electron microscope (SEM) system, an electron beam tomography (EBT) system, an electron beam lithography system, a spectroscopy system, a mass spectroscopy system, electron energy loss spectroscopy (EELS) system, auger electron spectroscopy (AES) system, an electron beam ion trap (EBIT) spectroscopy system, a free electron laser system, and the like. Such systems are collectively referred to herein as electron beam analysis systems.

The method begins at 10 and optionally and preferably continues to 11 at which a particle beam, such as, but not limited to, electron beam, is generated, for example, by a particle beam analysis system employing particle gun, such as an electron gun or the like. Alternatively, the generation of the beam is not part of the method, at which case the method receives the beam from the particle gun. At 12 the particle beam is optionally and preferably focused, for example, by a beam focusing system, such as an electromagnetic or electrostatic lens. The method optionally and preferably continues to 13 at which the particle beam is transmitted through a phase mask. The phase mask is preferably selected to spatially modulate a phase of the beam over a cross-section of the beam. Preferably, but not necessarily, the phase modulation is selected to compensate, at least partially, for aberrations generated by the beam focusing system. The beam can pass through the focusing system either before or after it is transmitted through the mask. It is appreciated that it is not necessarily for the mask to be placed in the focal or image plane of the focusing system. It is additionally appreciated that when there are several focusing systems a mask can be used for each focusing system. Alternatively or additionally, a mask can be used to for compensating, at least partially, accumulated aberrations generated during the passage of the beam through two or more focusing systems.

Further, the mask can be spaced apart from the focusing system or it can be integrated with the focusing system.

In some embodiments of the present invention, the method continues to 14 at which an electromagnetic and/or electrostatic field is applied to the beam. The electromagnetic and/or electrostatic field is preferably a multipole field (e.g., quadrupole, hexapole, octapole, etc.).

The multipole field can be used as an active aberration corrector which is complementary to the phase mask. That is the combination of the effect caused by the phase mask and the effect caused by the multipole field reduces or eliminates the aberration. For example, the phase mask can be selected to reduce or eliminate spherical aberration and the multipole field can be selected to reduce or eliminate chromatic aberration. Another example is a configuration in which the mask provides aberration correction along a first axis and the multipole field provides correction along a second axis, wherein both axes are preferably perpendicular to each other and to the particle beam's axis (also referred to in the literature as the optical axis). An additional example is a configuration in which the mask causes a converging effect along the first axis, and the multipole field causes a diverging effect along the second axis, and an opposite configuration in which the multipole field cause a converging effect along the first axis, and the mask causes a diverging effect along the second axis.

It was found by the present inventors that such a combination of an active corrector and a phase mask can provide performance that is impossible to get otherwise.

The method ends at 15.

Figure 6:
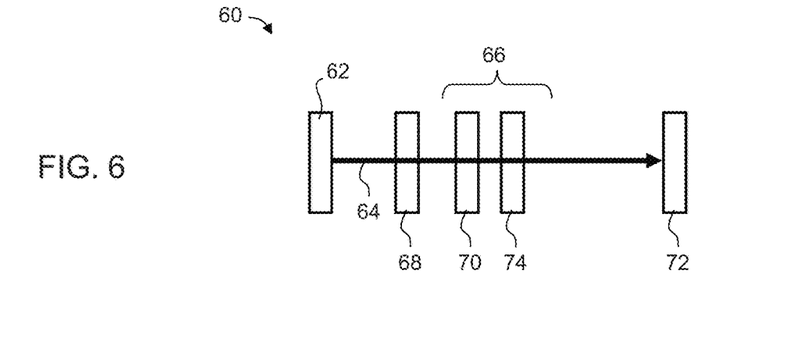
FIG. 6 is a schematic illustration of a particle beam system, according to some embodiments of the present invention.

FIG. 6 is a schematic illustration of a particle beam system 60, according to some embodiments of the present invention. System 60 can be electron beam analysis system, such as, but not limited to, a TEM system, a SEM system, an EBT system, an electron beam lithography system, a spectroscopy system, a mass spectroscopy system, an EELS system, an AES system, an EBIT system, and a free electron laser system.

System 60 comprises a particle beam source 62 configured for generating a particle beam 64 and a particle beam manipulation system 66. In some embodiments of the present invention system 60 also comprises a beam focusing system 68, such as, but not limited to, an electrostatic or electromagnetic lens, that is configured to focus beam 64 onto a sample 72.

Particle beam manipulation system 66 preferably comprises a phase mask 70 selected to spatially modulate a phase of beam 64 over a cross-section of beam 64. In some embodiments of the present invention phase mask 70 modulates the phase of beam 64 so as to at least partially compensate for aberrations generated by focusing system 68. In the schematic illustration of FIG. 6, mask 70 is shown positioned behind focusing system 68. However, this need not necessarily be the case, since, for some applications, it may be desired to position mask 70 in front of focusing system 68. Further, the present embodiments also contemplate configurations in which focusing system 70 is integrated with mask 68.

Particle beam manipulation system 66 optionally and preferably also comprises an electromagnetic or electrostatic lens 74. Lens 74 applies an electromagnetic and/or electrostatic field, which is preferably a multipole field (e.g., quadrupole, hexapole, octapole, etc.). Lens 74 can serve as an active aberration corrector complementary to mask 70, as further detailed hereinabove.

Various types of phase masks are contemplated to be used by the method and system of the present embodiments. Generally, the phase mask provides a predetermined pattern (e.g., a phase pattern, an intensity pattern) at a predetermined plane. The predetermined plane can be, for example, the image plane or the diffraction plane of the focusing system of the particle, e.g., electron beam analysis system.

As used herein "image plane" refers to a plane defined by a plurality of points wherein each such point is an intersection point of two or more particle trajectories passing through the same point of a sample.

As used herein "diffraction plane" refers to a plane defined by a plurality of points wherein each such point is an intersection point of two or more particle trajectories passing through respective two or more different points of the sample.

The phase mask is typically formed of a solid material having a non-uniform thickness. In various exemplary embodiments of the invention, the thickness is selected such that at least 70% of the particles successfully pass through the solid material. The spatial distribution of the thickness over the area of the phase mask is described by a thickness function that can be discrete or continuous.

A continues distribution of the thickness can be embodied as a thickness that gradually varies across the mask.

A discrete distribution of the thickness can be embodied as a pattern of spaced apart spatial features, wherein the thickness of the solid material between spatial features is different from the thickness of the solid material at the spatial features. The spatial features can be of one or more of: dots, linear segments, curves, two-dimensional regions and the like. Typically, the spatial features are characterized by a grid of coordinates which can be a rectangular grid or a non-rectangular grid. For example, when the spatial features are dots, they can form a lattice of dots over the grid which may be periodic, quasi-periodic or a-periodic. Typically, but not necessarily, the solid material between two adjacent spatial features is thicker than at those spatial features. Thus, for example, the spatial features can form a groove pattern.

In some embodiments of the present invention the thickness function varies according to the fourth power of a distance from the center of the mask. These embodiments are useful for correcting spherical aberration, and are particularly useful for relatively small angular aperture (e.g., less than 0.1 radians or less than 0.05 radians or less than 0.025 radians or less than 0.0125 radians).

In some embodiments of the present invention the thickness function over the phase mask is selected such as not to exceed a critical point at which the accumulated phase equals a predetermined threshold. These embodiments are also useful for correcting large aberration values, or imposing large phase changes with minimal material thickness, and are particularly useful for larger angular aperture (e.g., above 0.1 radians). A suitable accumulated phase threshold is, for example, about $2\pi$.

In some embodiments of the present invention the thickness function of the phase mask is binary. Such thickness function describes a phase mask having only two thickness values across the mask.

Representative examples of various types of thickness functions suitable for the present embodiments are provided in the Examples section that follows.

The phase mask can be made of any material that is transmissive to the particle beam, e.g., electron beam. Representative examples including, without limitation, silicon, silicon nitride (SiN), silicon carbide (SiC), silicon oxide (SiO2), boron nitride (BN), carbon, aluminum, gold, silver and diamond. Preferred thickness of the mask, at regions of highest thickness, is less than 100 nm.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

In light optics, using matter's refractive index to control light is known. In electron microscopy and materials science, deliberate manipulation of the electron beam by custom fabrication of thin masks is almost non-existent or sought-after. Lately, there has been a growing number of publications on manipulation of electron beams using binary (amplitude) masks, rather than phase masks. It was found by the present inventors that phase masks offer a higher energy throughput and larger bandwidth than binary gratings.

Diffractive Electron Optics Elements for Shaping the Wave Front of an Electron Beam This Example relates to the manipulation of coherent electron-beams using diffractive-electron-optics elements (DEOE). A coherent free-electron beam source such as the Field Emission Gun used in the Transmission Electron Microscope (TEM) is optionally and preferably employed. Samples for observation in TEM can be placed on a grid or a membrane such as, but not limited to, any of the standard 3 mm-diameter grids or membranes. In some embodiments of the present invention thin Silicon-Nitride (SiN) membranes ranging from 5 nm to 150 nm in thickness are used. The advantage of these membranes is that they have low scattering and are mechanically robust. Much like light waves passing through glass and acquiring a phase-shift dependent on the material's refractive index, an electron passing through a SiN membrane similarly accumulates a phase factor directly related to the thickness of the interacting material according to [Reimer and Kohl, Springer, Transmission Electron Microscopy, 5th Ed. pg. 52]

$$\varphi = \frac{2\pi}{\lambda}(n-1)t = \frac{2\pi}{\lambda}\frac{eU_i}{E}\frac{E_0 + E}{2E_0 + E}t \qquad (1)$$

where $\lambda$ is the electron's wavelength, $E_0 = m_0 c^2$ and $E = eU$ are the electron's rest and kinetic energy, respectively, where the kinetic energy is given by the acceleration voltage U and the electron's charge e. The remaining quantities are the thickness t and the material's inner potential $U_i$, which comprises the electron-optical refractive index n(E).

Figure 1A:
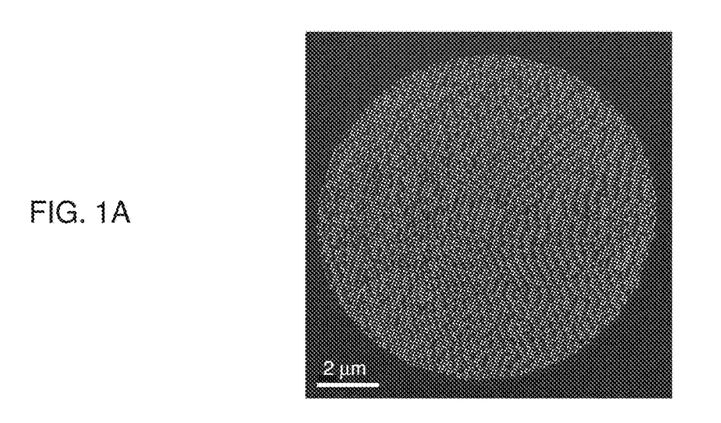
FIG. 1A is an example of a TEM image of a diffractive-electron-optics element, according to some embodiments of the present invention. Brighter dots have thinner material thickness.
Figure 1B:
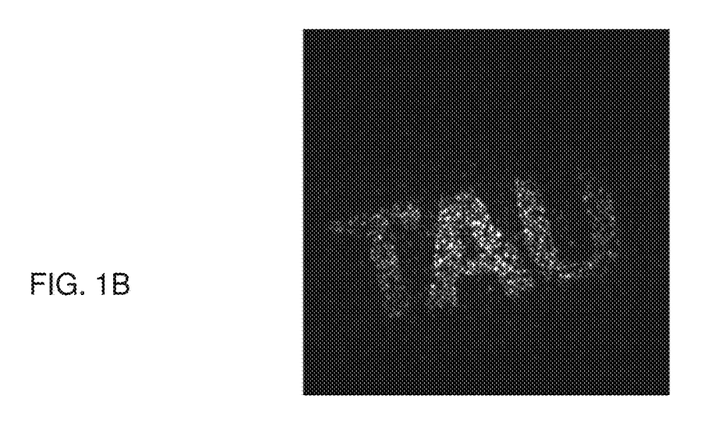
FIG. 1B is a diffraction image of the diffractive-electron-optics element of FIG. 1A.

The DEOE according to some embodiments of the present invention is fabricated employing a Focused Ion Beam (FIB) to mill through the SiN membrane, creating a desired spatial variance of thicknesses which is designed using holographic algorithms. An example of a fabricated hologram and the obtained electron beam are shown in FIGS. 1A-B. The DEOE can be phase-based and/or amplitude-based, and may have any number of levels. In some embodiments of the present invention the DEOE has only two levels. Such DEOE is referred to herein as a binary DEOE.

Correction of Aberration in Electron Lenses, Such as Those in Electron Microscopes In some embodiments of the present invention the DEOE is used for the correction of spherical aberrations of electron lenses.

The de-Broglie wavelength of the electron in the standard TEM (acceleration voltage in the $10^5$[V] range) is approximately 2 picometers. According to Abbe's principle, this enables measurements with picometer resolution. However, the resolution of a high-resolution TEM is almost 100 times worse than that (about 0.2 nanometers), due to the spherical aberration of the objective lens. This is a well-known problem with which prominent scientists have struggled starting from the early days of the TEM, back in the 1930s. Methods for aberration correction do exist nowadays, but they are very complex and expensive. For example, correction can be done by taking a series of images of the object under variable objective focus conditions [E. J. Kirkland, *Ultramicroscopy* 15, 151-172 (1984)], or by holographic techniques [A. Tonomura et al, *Jpn. J. Appl. Phys.* 18, 1373-1377 (1979)]. In recent years, aberration correction was implemented by adding quadrupoleoctopole [O. L. Krivanek, *Ultramicroscopy* 78, 1-11 (1999)] or hexapole [M. Haider et al, *Nature* 392, 768 (1998)] electromagnetic correctors. These, however, are complicated elements which make the microscope much more expensive.

The present inventors found that the aberration of the electron lenses can be corrected by adding a thin film whose shape and thickness are controlled using nano-fabrication techniques, such as focused-ion beam milling. This film can be a patterned phase plate for the electron that shapes its wavefront in order to balance the distortion of the electron lenses.

Aberrations in Electron Lenses

The electrons are focused in the TEM using magnetic lenses. These lenses consist of a coil through which current is injected. This coil is held inside a metal shield that has a hole in the middle through which the electrons pass and get focused. This lens creates a bell-shaped magnetic field along the optical axis. More complicated lenses are quadrupole lenses that are constructed from four poles of opposite polarity, as well as hexapole and octopole lenses that consist of either six or eight poles, respectively. Most of the high-resolution TEMs operate with standard polepiece lenses. Advanced electron microscopes also include combinations of hexapole or quadrupole and octopole lenses that are used to correct lens aberrations.

Figure 2A:
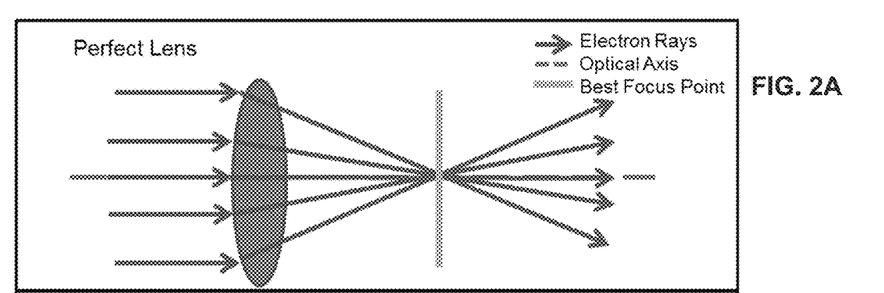
FIG. 2A illustrates a perfect lens where all rays are converging into a single point.
Figure 2B:
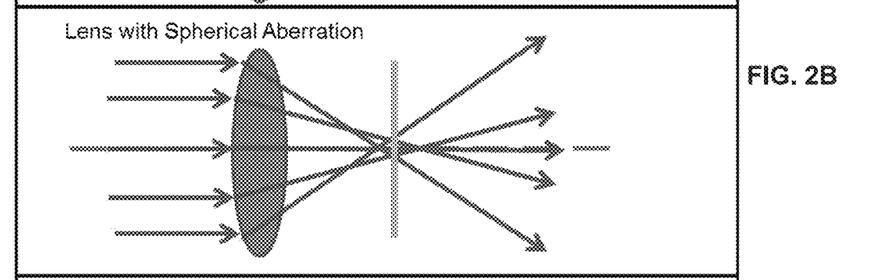
FIG. 2B illustrates a lens with spherical aberration. For rays that pass farther away from the optical axis, the focal length is shorter and therefore the image is blurred.

It was found by the present inventors that conventional magnetic lenses are far from perfect, and suffer from severe aberrations. An example is spherical aberration wherein electron rays that pass farther away from the optical axis have shorter focal length, as shown in FIG. 2B. As a result of this aberration, the rays are not focused to a point at the focal plane, but to a circular spot of a finite size.

Owing to this aberration, the smallest diameter that can be observed in a specimen is $d_{min}=0.5C_s\alpha^3$, where $C_s$ is the lens spherical aberration constant and $\alpha$ is the angular spread of the electron beam. The spherical aberration constant is typically in the range 0.5-2 mm. Hence, for $C_s$=0.5 mm, $\alpha$=10 mrad the smallest diameter that can be observed in a specimen is $d_{min}$=0.25 nm, which is already twice larger than the diffraction limit for the same angular aperture.

The effect of the aberration can also be described in terms of wavefront distortion. An ideal lens converts a planar wavefront to a spherical wavefront which later converges to the image point. However, owing to spherical aberrations, the wavefront beyond a lens is more strongly curved in the outer zones of the lens, with respect to the ideal spherical wave, and therefore the outer part of the beam focuses at a shorter distance with respect to the part that is close to the optical axis. Let ΔS be the optical path difference between the ideal spherical wave and the actual wave that is obtained from the lens, and let W be the corresponding phase difference (also known as wave aberration)

$$W = \frac{2\pi\Delta S}{\lambda}. \quad (2)$$

In the case of spherical aberration and assuming that there is no defocusing:

$$W(\theta) = \frac{\pi C_s \theta^4}{2\lambda}. \quad (3)$$

This means that the spherical aberration results in wavefront distortion that scales as the fourth power of the conical angle θ, which is also the fourth power of the aperture radius r≈θf, where f is the lens focal length.

In addition to spherical aberrations there are other aberrations, such as distortion, axial astigmatism, coma and chromatic aberrations. Usually, the spherical aberration is dominant.

Aberration of the magnetic lenses in the high-resolution TEM is limiting its resolution to ~0.2 nm, which is approximately 100 times larger than the de-Broglie wavelength of the electrons in the TEM. Scientists have struggled to overcome this limitation already from the early days of the TEMs, in the 1930s. It was shown already in 1936 by Otto Scherzer that spherical and chromatic aberrations cannot be eliminated in rotationally symmetric electron lenses [O. Scherzer, *Z. Physik* 101, 593-603 (1936)]. Scherzer proposed various ways for correcting chromatic and spherical aberrations [O. Scherzer, *Optik* 2, 114-132 (1947)]. Among them is the proposal to use electrostatic or magnetic multipole elements for correcting chromatic and spherical aberrations, as well as some other suggestions, such as use of charge foils, mirrors, high frequency lenses, etc. Dennis Gabor proposed the concept of holography as a method of overcoming the limits of aberrations [D. Gabor, *Nature* 161, 777-778 (1948)]. The implementation of these concepts proved to be very challenging, and it took 40 years until Haider et al published the first images obtained using a TEM that included hexapole elements for aberration correction [M. Haider et al, *Nature* 392, 768 (1998)], following an approach proposed by Rose. Krivanek et al showed correction of spherical aberration of using a quadrupoleoctopole system [O. L. Krivanek, *Ultramicroscopy* 78, 1-11 (1999)]. These multipole correctors provided nearly a factor of two improvement in resolution, from 0.24 nm to 0.14 nm. State of the art commercial aberration-corrected TEMs provide nowadays a slightly better resolution of ~0.08 nm. However, the multipole correctors cannot be simply added to an existing TEM, the design and implementation is quite delicate, and the cost of aberration corrected microscope is about twice than that of a high resolution TEM (e.g. ~2.7 MEuro for Cs-corrected Titan G2 vs. ~1.5 MEuro for high-resolution Tecnai F20). Moreover, the resolution is still quite far from the electron wavelength.

The present inventors discovered that the DEOE can be used for aberration correction. The DEOE is fabricated by nano-fabrication, and the present inventors showed that the DEOE can control the wave-front of the electron wavefunction. Rather than applying electromagnetic forces, the electron is controlled by modulating its wave-front in the nano-fabricated element. In some embodiments of the present invention thin films whose shape and thickness are controlled by focused ion beam milling are prepared, so that the electron wavefunction undergoes a different phase shift at each of at least some points of the film. This space-dependent phase is designed according to some embodiments of the present invention to cancel the aberrations that are added by the electron lens.

Figure 2C:
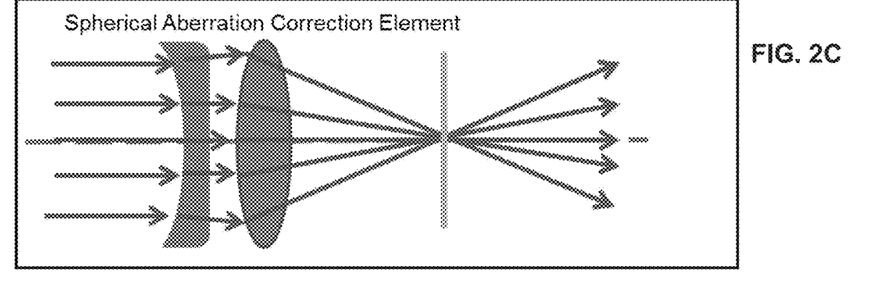
FIG. 2C illustrates a correction of the spherical aberration by adding a phase plate with $R^4$ dependence.

In order to illustrate the technique of the present embodiments, a spherical aberration is considered. This aberration is equivalent to a wavefront deviation from the ideal spherical wave which scales $r^4$, where r is the radial coordinate at the aperture. Hence, if the electron beam passes through a plate whose thickness also scales as $r^4$ before entering the lens, it accumulates a space-dependent phase shift that exactly cancels the aberration of the lens, as illustrated in FIG. 2C. Assuming lens focal length of 2 mm and electron wavelength of 2.5 pm (which is obtained with a voltage of 200 kV), the shape of the wavefront distortion is given by $$\Delta s(r) = \frac{\pi C_s r^4}{2\lambda f^4}. \tag{4}$$

The highest distortion is obtained at the largest radius of the aperture, $\theta f \approx 20$ μm, and is equal to approximately $\pi$ radians. In silicon for example, the accumulated phase with respect to air in a layer of thickness t is given by $$\Delta \varphi = \frac{2\pi}{\lambda}(n-1)t \approx \frac{2\pi}{2.5 \times 10^{-12}} 2.7 \times 10^{-5} t \approx 6.8 \times 10^7 t. \tag{5}$$

Figure 3A:
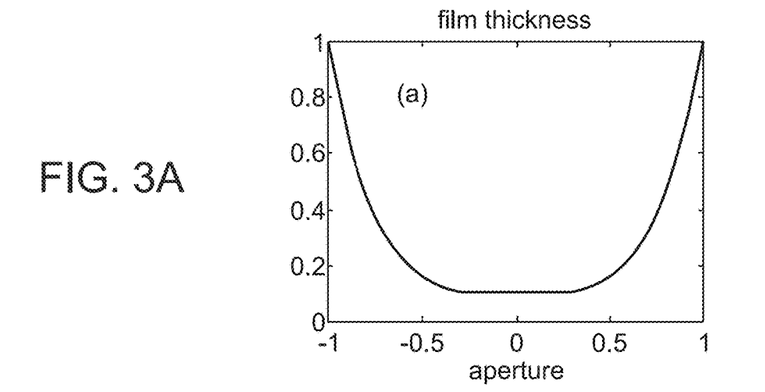
FIGS. 3A-C show three types of aberration correctors, according to some embodiments of the present invention.

This means that a thickness of 46 nm generates a phase shift of $\pi$. The phase shift corrector can therefore be of variable thickness of the form $d(r)=d_0+d_1 r^4$, with a thickness that is 46 nm thicker in the edge of the plate with respect to its center, as shown in FIG. 3A. Assuming the thickness at the center is $d_0=10$ nm, it becomes 56 nm at the edges, still smaller than the typical mean free path in silicon, which is more than 100 nm. The present inventors showed the transmission of electrons through a plate fabricated according to some embodiments of the present invention, which already shows the $r^4$ dependence.

Figure 3B:
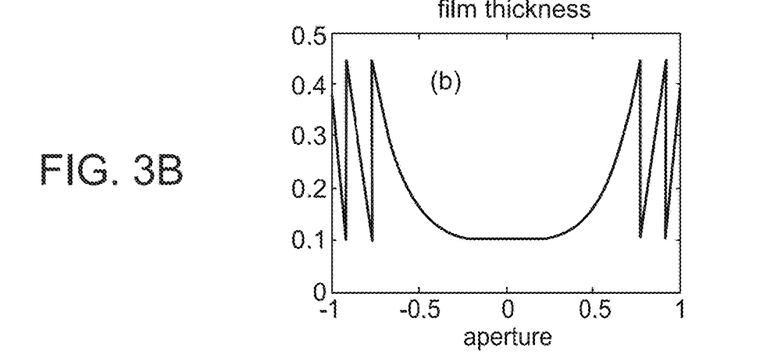

While this type of phase plate is suitable, for example, for a lens with a small numerical aperture (e.g., 10 mrad or less), the resolution can be improved by operating with lenses having larger numerical aperture, whose diffraction limit $\lambda/(2 \sin \theta)$ is therefore smaller. This translates to larger apertures, and hence to larger spherical aberration, wherein thicker compensating films can be used. To avoid or reduce scattering, a "zone-plate" type of compensators can be used. In these embodiments, the thickness function optionally and preferably does not exceed a critical point in which the accumulated phase is $2\pi$. Beyond this point, the thickness is set back to the minimum value, as shown in FIG. 3B.

In some embodiments a binary phase plate that has only two possible values of the thicknesses is employed. In these embodiments, a high frequency carrier modulation for imposing amplitude and phase information can be used.

$$d(r)=d_0+0.5d_1\{1+\text{sign }[\cos(2\pi r/\Lambda+ar^4)]\} \tag{6}$$

Figure 3C:
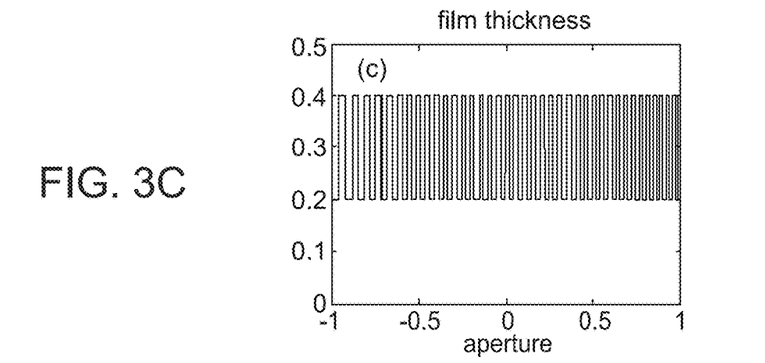

An example is shown in FIG. 3C. This allows obtaining a corrected image at the first diffraction order.

In some embodiments of the present invention a hybrid corrector is employed. The hybrid corrector combines nano-fabricated phase plate with a multipole electromagnetic lens. This allows splitting the tasks of aberration compensations between the two types of correctors. It was found by the present inventors that such a hybrid corrector can provide performance that is impossible to get otherwise.

Figure 4A:
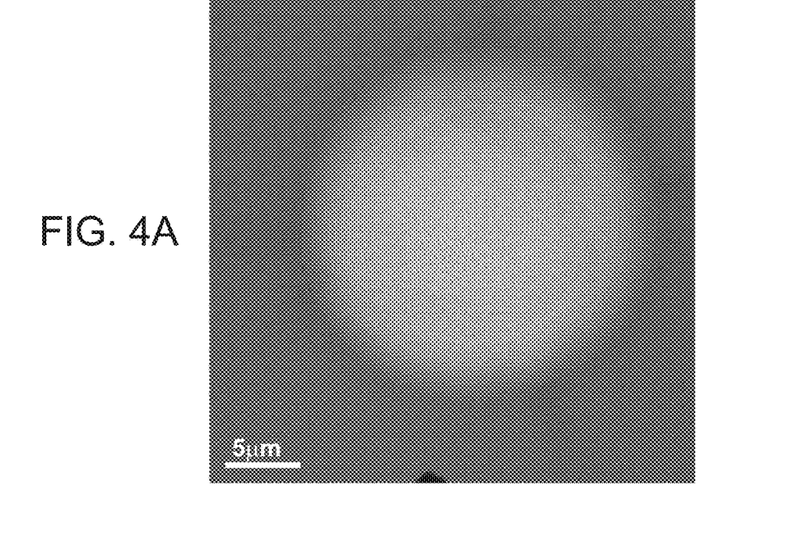
FIG. 4A shows transmission of electron beam through engineered phase plate fabricated by FIB milling of Silicon film. The brightness of each point in the recorded image depends on the thickness of a corresponding point in the fabricated film.
Figure 4B:
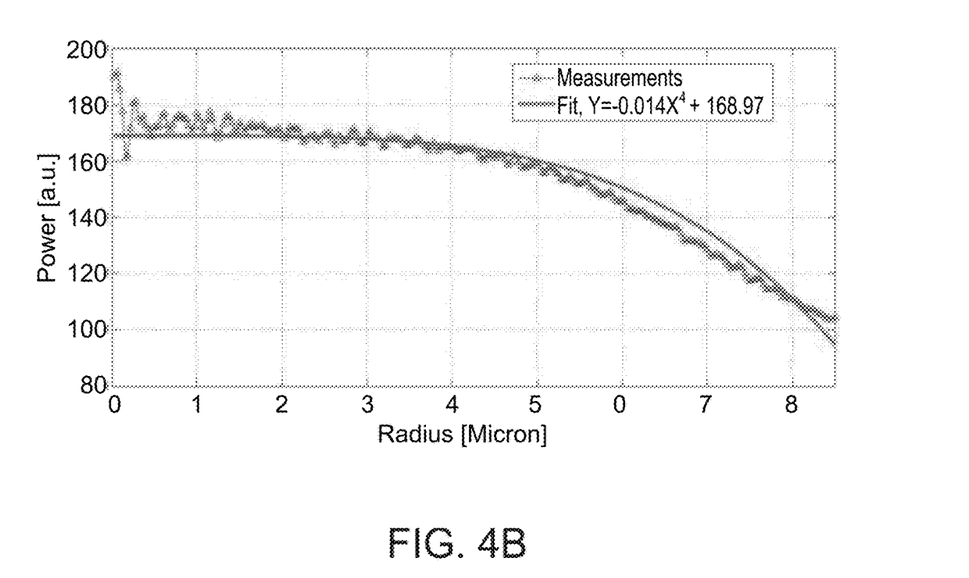
FIG. 4B shows a polynomial fit to the measured intensity of FIG. 4A, showing $R^4$ dependence.

(A) Variable Thickness Corrector:

Several samples have been fabricated to test the ability of the present embodiments to properly shape the thickness of the phase plate. Amorphous silicon film of 40 nm thickness was placed on top of a TEM grid. The film was then thinned by milling circles in FIB, using a 35 kV Galium beam with 20 pA current. 15 concentric circles with different radii were milled, each one milling ~1/15 of the total film thickness. The radius of each circle was determined by the $R^4$ function. The circles were milled starting with the smaller central circle and the subsequent circles were then milled outwards from the center with a step size of 5 nm. The films were then inserted into the TEM and images of the electron beam that passes through them were recorded. An example is shown in FIG. 4A. In these thin films, the brightness of each area in the image is nearly linearly proportional to the thickness of the film. By analyzing the brightness of the image as a function of the radial coordinate the profile of the shape after the milling process is estimated. Using this analysis, films whose recorded intensity patterns show the required $R^4$ dependence have been obtained, as shown in FIG. 4B.

(B) "Zone-Plate" Corrector

A "zone-plate" corrector according to some embodiments of the present invention is shown in FIG. 3B. Such a corrector can be fabricated using high resolution FIB, electron beam nano-lithography and the like. Electron beam nano-lithography was applied to fabricate Fresnel lenses for electrons [Ito et al, *Nature* 394, 49-52 (1998)]. The potential advantage here is the ability to compensate for much larger wave-front deviations, with respect to the simpler variable thickness corrector.

(C) Binary Thickness Corrector

A binary thickness corrector is shown in FIG. 3C. This corrector has two possible thicknesses: the original thickness of the sample, and the milled thickness determined by the FIB. A binary thickness corrector can be used to correct many types of wavefront distortions. In some embodiments, binary thickness corrector is used to compensate for the chromatic aberration [D. C. O'Shea et al, "Diffractive optics, design, fabrication and testing", SPIE Press (2004)], and spherical aberration.

A DEOE according to some embodiments of the present invention can also be fabricated by means of nano-fabrication other than a FIB. Representative examples include, without limitation, e-beam lithography, optical lithography and later mass-production by nano-imprinting. The free-electron source and lens setup can be TEM, or any other electron source and lens setup. Representative examples include, without limitation, scanning electron microscopes, free-electron lasers and any device that creates or manipulates electron beams. Specifically, electron lenses may be magnetic or electric.

The DEOE of the present embodiments can be discrete (for example, characterized by a rectangular lattice composed of distinct dots), or characterized by a non-rectangular lattice or be continuous. The DEOE can, in some embodiments of the present invention, be composed of shapes other than dots. The DEOE can, in some embodiments of the present invention, include sub-lattices. DEOE can, in some embodiments of the present invention, be arranged as entirely continuous shapes with any desired topographical mapping of heights that result in a desired pattern in the diffraction plane or the image plane of the lens system.

The DEOE can be made of any material that can facilitate phase modulation, once patterned. Typically, a low-scattering material is used so that only the phase of the electrons is controlled and energy throughput is maximal. However, for some applications variance of amplitude may be desired and appropriate materials may be chosen for this case. Also, DEOEs may be made by coalescing several different materials or alternately depositing some upon others to achieve the required phase and amplitude manipulation.

DEOEs may also be constructed in three-dimensions by planar techniques: depositing and spatially altering a layer of material, then repeating the process to yield any number of layers each of which with its own geometrical or material composition.

Aside from generic, elemental materials such as gold, silver, silicon etc., DEOEs may be based on composite structures such as carbon-based structures or nano-fabricated electronics, or elements that respond to external stimulation such as laser light, temperature change, etc.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of manipulating a particle beam, comprising transmitting the beam through a phase mask selected to spatially modulate a phase of a wavefront of the beam over a cross-section thereof, wherein said phase mask has a non-uniform thickness that varies gradually or discretely across said phase mask and is characterized by a thickness function that does not exceed a critical point in which the accumulated phase equals a predetermined threshold.

2. The method of claim 1, wherein said phase modulation is selected to at least partially compensate for aberrations generated by a beam focusing system.

3. The method according to claim 2, further comprising applying a multipole electromagnetic field to the beam.

4. A phase mask, comprising a solid material being transmissive to a particle beam and being patterned such to spatially modulate a phase of a wavefront of said particle beam over a cross-section of said particle beam, the phase mask having a non-uniform thickness that varies gradually or discretely across said phase mask and being characterized by a thickness function that does not exceed a critical point in which the accumulated phase equals a predetermined threshold.

5. A system for manipulating a particle beam, comprising the phase mask according to claim 4.

6. The system of claim 5, further comprising a beam focusing system, wherein said phase modulation is selected to at least partially compensate for aberrations generated by said beam focusing system.

7. The system of claim 6, wherein said beam focusing system is positioned in front or behind said phase mask.

8. The system of claim 6, wherein said beam focusing system is integrated with said phase mask.

9. A particle beam system, comprising a particle beam source and a particle beam manipulation system, wherein said particle beam manipulation system comprises the system according to claim 5.

10. The system of claim 9, being configured as one of a transmission electron microscope system, a scanning electron microscope system, an electron beam tomography (EBT) system, an electron beam lithography system, a spectroscopy system, a mass spectroscopy system and a free electron laser system.

11. The system according to claim 6, further comprising an electromagnetic or electrostatic lens.

12. The system according to claim 6, wherein said phase mask is selected to provide a predetermined pattern at an image plane of said beam focusing system.

13. The system according to claim 6, wherein said phase mask is selected to provide a predetermined pattern at a diffraction plane of said beam focusing system.

14. The method according to claim 2, wherein said aberrations comprise spherical aberrations.

15. The method according to claim 2, wherein said aberrations comprise chromatic aberrations.

16. The method according to claim 2, wherein said aberrations comprise at least one type of aberrations selected from the group consisting of astigmatism and trefoil.

17. The method according to claim 1, wherein said phase mask is discrete.

18. The method according to claim 1, wherein said phase mask is continuous.

19. The method according to claim 1, wherein said phase mask is characterized by a rectangular lattice.

20. The method according to claim 1, wherein said phase mask is characterized by a non-rectangular lattice.

21. The method according to claim 1, wherein a thickness of said phase mask vary across a surface thereof.

22. The method according to claim 1, wherein said predetermined threshold is selected from the group consisting of about $\pi$ and about $2\pi$.

23. The method according to claim 1, wherein said phase mask is a binary thickness phase mask.

24. The method according to claim 1, wherein the particle beam is a substantially coherent particle beam.

25. The method according to claim 1, wherein said phase mask is selected to modulate an amplitude of the particle beam.

* * * * *